(12) United States Patent
Miura et al.

(10) Patent No.: US 8,896,399 B2
(45) Date of Patent: Nov. 25, 2014

(54) ACOUSTIC WAVE DEVICE AND MODULE INCLUDING A DIELECTRIC FILM WITH AN INCLINED UPPER SURFACE

(71) Applicant: Taiyo Yuden Co., Ltd., Tokyo (JP)

(72) Inventors: Michio Miura, Tokyo (JP); Satoru Matsuda, Tokyo (JP); Takashi Yamashita, Tokyo (JP); Hiraki Domon, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 229 days.

(21) Appl. No.: 13/725,514

(22) Filed: Dec. 21, 2012

(65) Prior Publication Data

US 2013/0106536 A1    May 2, 2013

Related U.S. Application Data

(63) Continuation of application No. PCT/JP2011/061471, filed on May 19, 2011.

(51) Int. Cl.
*H03H 9/64* (2006.01)
*H03H 9/25* (2006.01)
*H03H 9/02* (2006.01)
*H03H 3/08* (2006.01)

(52) U.S. Cl.
CPC ............. *H03H 9/25* (2013.01); *H03H 9/02858* (2013.01); *H03H 9/64* (2013.01); *H03H 3/08* (2013.01)
USPC ..... 333/195; 333/194; 310/313 B; 310/313 D

(58) Field of Classification Search
USPC ........... 333/133, 193–196; 310/313 B, 313 D
See application file for complete search history.

(56) References Cited

U.S. PATENT DOCUMENTS 6,940,208 B2 * 9/2005 Kando ................. 310/313 R
7,132,779 B2 * 11/2006 Kando ................. 310/313 R
(Continued)

FOREIGN PATENT DOCUMENTS

JP    2005-244359 A    9/2005
JP    2007-110342 A    4/2007
(Continued)

OTHER PUBLICATIONS

English translation of Written Opinion (PCT/ISA/237) issued in PCT/JP2011/061471 mailed in Jul. 2011.
(Continued)

*Primary Examiner* — Barbara Summons
(74) *Attorney, Agent, or Firm* — Chen Yoshimura LLP

(57) ABSTRACT

An acoustic wave device includes: a substrate; a dielectric film formed on the substrate; opposing comb-shaped electrodes located between the substrate and the dielectric film, each of the opposing comb-shaped electrodes including an electrode finger, wherein at least one of the substrate and the dielectric film is a piezoelectric substance, an upper surface of the dielectric film, which is located above a gap between a tip of an electrode finger of one of the opposing comb-shaped electrodes and the other of the opposing comb-shaped electrodes, is inclined against an upper surface of the substrate in an extension direction of the electrode finger, and an inclination angle of the upper surface of the dielectric film against the upper surface of the substrate is equal to or larger than 30° and equal to or smaller than 50°.

7 Claims, 21 Drawing Sheets

(56) References Cited

U.S. PATENT DOCUMENTS

| | | |
|---|---|---|
| 2009/0206954 A1 | 8/2009 | Hashimoto et al. |
| 2010/0219905 A1 | 9/2010 | Nakamura et al. |
| 2011/0215883 A1* | 9/2011 | Fujiwara et al. ............... 333/195 |
| 2011/0215884 A1* | 9/2011 | Fujiwara et al. ............... 333/195 |
| 2012/0044027 A1 | 2/2012 | Nakanishi et al. |
| 2012/0313483 A1* | 12/2012 | Matsuda et al. ............... 310/313 |

FOREIGN PATENT DOCUMENTS

| | | | |
|---|---|---|---|
| JP | 2009-290472 | * | 12/2009 |
| WO | 2006/078001 A1 | | 7/2006 |
| WO | 2008/078573 A1 | | 7/2008 |
| WO | 2010/137279 A1 | | 12/2010 |

OTHER PUBLICATIONS

International Search Report (ISR) issued in PCT/JP2011/061471 mailed in Jul. 2011.

Written Opinion (PCT/ISA/237) issued in PCT/JP2011/061471 mailed in Jul. 2011.

* cited by examiner

1

ACOUSTIC WAVE DEVICE AND MODULE INCLUDING A DIELECTRIC FILM WITH AN INCLINED UPPER SURFACE

CROSS-REFERENCE TO RELATED APPLICATION

This application is a continuation application of PCT/JP2011/061471 filed May 19, 2011, the contents of which are herein wholly incorporated by reference.

FIELD

The present invention relates to an acoustic wave device and a module, and relates to an acoustic wave device and a module having a comb-shaped electrode for example.

BACKGROUND

Acoustic wave devices are used as filter elements and oscillators of wireless devices for example. There has been known a surface acoustic wave (SAW: Surface Acoustic Device) device as a device using acoustic waves. The SAW device is used to a variety of circuits processing radio signals in a frequency of 45 MHz to 2 GHz such as a transmission bandpass filter, a reception bandpass filter, a filter for a local oscillator, an antenna duplexer, an IF (Intermediate frequency) filter, and an FM (Frequency Modulation) modulator.

The SAW device has an IDT (Interdigital Transducer) including two opposing comb-shaped electrodes. The comb-shaped electrode has a bus bar and electrode fingers extending from the bus bar to a same direction and exciting acoustic waves. The electrode fingers of the opposing comb-shaped electrodes are arranged in an alternate order. The acoustic wave is propagated to a direction intersecting with an extension direction of the electrode fingers. However, generated is a lateral-mode spurious caused by the acoustic wave propagated to a direction of the electrode fingers. There has been examined a method that provides a dummy electrode of one comb-shaped electrode to a tip of an electrode finger of another comb-shaped electrode so as to form a gap, and scatters an acoustic wave in a lateral mode by making a length of the dummy electrode different from a length of a dummy portion of a cross electrode arranged adjacent to the dummy electrode in order to suppress the spurious as disclosed in International Publication Pamphlet No. WO 2006/078001. There has been known a method that forms a dielectric film on an electrode finger but does not form a dielectric film on a bus bar to suppress the spurious as disclosed in International Publication Pamphlet No. WO 2008/078573.

The acoustic wave to be excited is distributed to a dielectric film in an acoustic wave device in which the dielectric film is formed on a substrate. Thus, the method of Patent Document 1 scatters a part of the acoustic wave in the lateral mode in a boundary face between the substrate and the dielectric film. However, it is difficult to scatter the acoustic wave within the dielectric film. Therefore, the suppression of the spurious is not sufficient. In addition, when the method of the Patent Document 2 is used, a surface of the bus bar and the like is exposed from the dielectric film. This may decrease a reliability.

SUMMARY OF THE INVENTION

According to an aspect of the present invention, there is provided an acoustic wave device including: a substrate; a dielectric film formed on the substrate; opposing comb-shaped electrodes located between the substrate and the dielectric film, each of the opposing comb-shaped electrodes including an electrode finger, wherein at least one of the substrate and the dielectric film is a piezoelectric substance; an upper surface of the dielectric film, which is located above a gap between a tip of an electrode finger of one of the opposing comb-shaped electrodes and the other of the opposing comb-shaped electrodes, is inclined against an upper surface of the substrate in an extension direction of the electrode finger, and an inclination angle of the upper surface of the dielectric film against the upper surface of the substrate is equal to or larger than 30° and equal to or smaller than 50°. According to the present invention, it is possible to suppress a spurious.

According to another aspect of the present invention, there is provided a module including the above acoustic wave device.

DETAILED DESCRIPTION

Hereinafter, a description will be given of embodiments of the present invention with reference to drawings.

First Embodiment

Figure 1A:
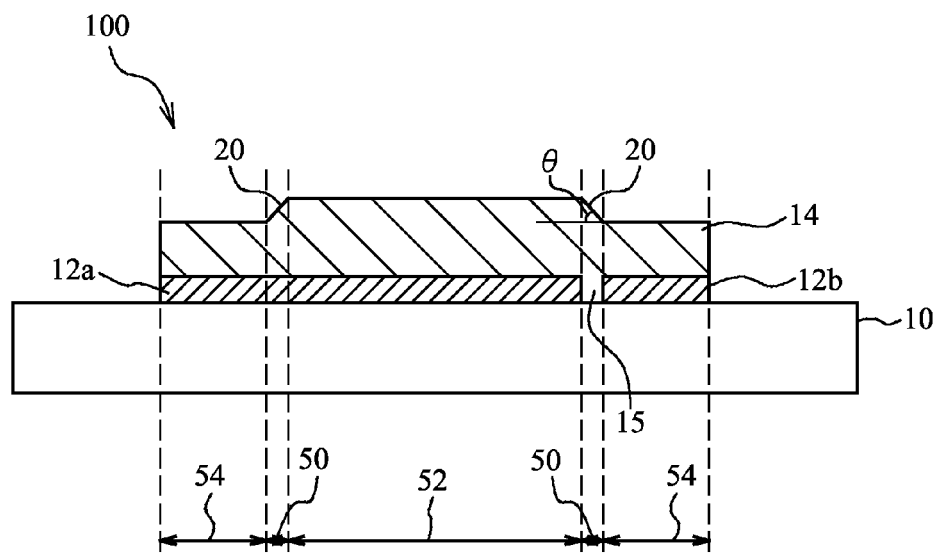
FIG. 1A is a cross-sectional view of a resonator 100 in accordance with a first embodiment.
Figure 1B:
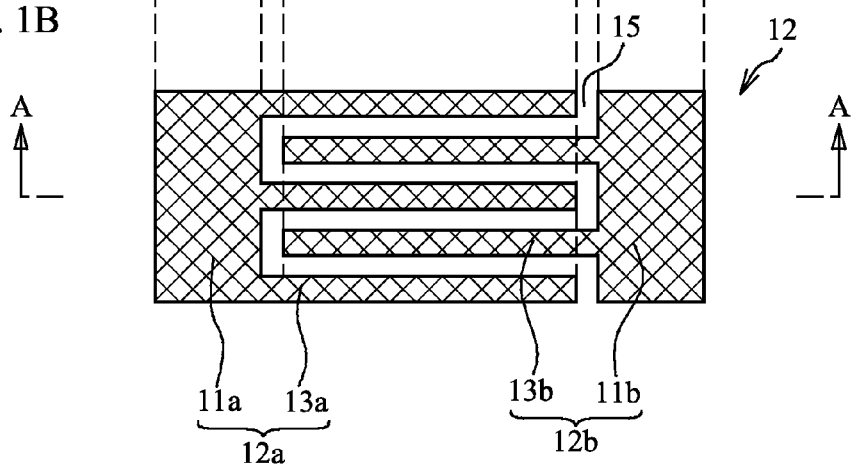
FIG. 1B is a plain view of a part of the resonator 100.

A first embodiment is an exemplary resonator as an acoustic wave device. FIG. 1A is a cross-sectional view of a resonator 100 in accordance with the first embodiment, and FIG. 1B is a plain view of a part of the resonator 100. FIG. 1A corresponds to a cross-sectional view taken along line A-A in FIG. 1B. As illustrated in FIG. 1A and FIG. 1B, a dielectric film 14 such as a silicon oxide film is formed on a substrate 10 having a piezoelectricity such as lithium niobium oxide or lithium tantalum oxide for example. Comb-shaped electrodes 12a and 12b made of a metal film such as Cu are formed between the substrate 10 and the dielectric film 14. The comb-shaped electrodes 12a and 12b are formed so as to oppose each other, and form an IDT 12. The comb-shaped electrodes 12a and 12b have electrode fingers 13a and 13b and bus bars 11a and 11b respectively. The electrode fingers 13a and 13b extend to a same direction, and the electrode fingers 13a and 13b are arranged alternately. A region in which the electrode fingers 13a and 13b overlap is an overlap region 52, and regions of the bus bars 11a and 11b are bus bar regions 54.

A gap 15 exists between a tip of the electrode finger 13a or 13b included in one of the opposing comb-shaped electrodes 12a and 12b and the other one of the opposing comb-shaped electrodes 12a and 12b. A region of the gaps 15 is a gap region 50. An upper surface of the dielectric film 14 above the gaps 15 is inclined against an upper surface of the substrate 10 in an extension direction of the electrode fingers 13a and 13b. A region in which the upper surface of the dielectric film 14 is inclined is an inclination region 20. Equal to or more than 30° and equal to or smaller than 50° is an inclination angle θ of the upper surface of the dielectric film 14 against the upper surface of the substrate 10 in the inclination region 20. The inclination angle of the inclination region 20 may not be constant, and the inclination angle may be small in the vicinity of a periphery of the inclination region 20, and may be large in the vicinity of a center. In this case, the inclination angle θ is the most inclined angle of the inclination region 20.

Figure 2A:
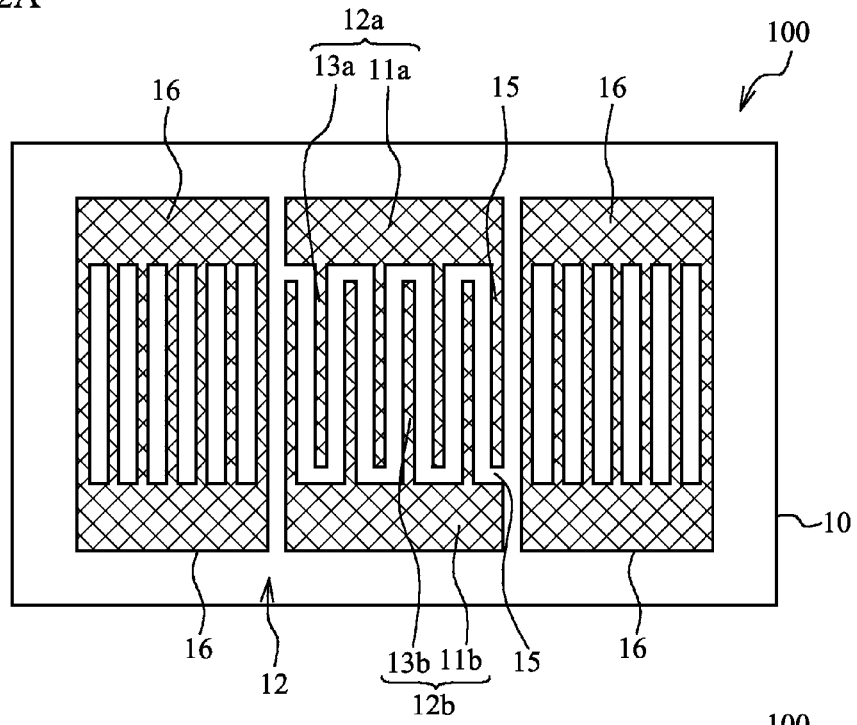
FIG. 2A and FIG. 2B are plain views of the resonator 100 in accordance with the first embodiment.
Figure 2B:
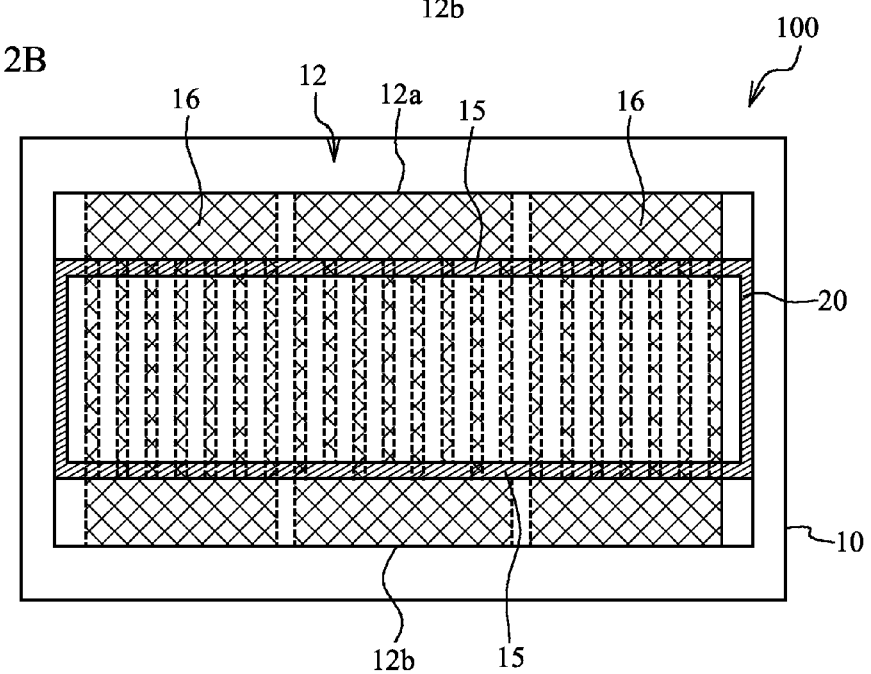

FIG. 2A and FIG. 2B are plain views of the resonator 100 in accordance with the first embodiment. FIG. 2A is a diagram viewing the dielectric film 14 transparently. As illustrated in FIG. 2A, reflectors 16 are located at both sides of the IDT 12 in a direction intersecting with the extension direction of the electrode fingers of the IDT 12. FIG. 2B is a diagram illustrating the dielectric film 14 and the inclination region 20, and the IDT 12 and the reflectors 16 are illustrated by dashed lines in FIG. 2B. As illustrated in FIG. 2B, the inclination region 20 is formed above the gaps 15 of the IDT 12. The inclination region 20 is continuously formed from the IDT 12 to the reflectors 16. The inclination region 20 is formed so as to surround the electrode fingers of the IDT 12 and electrode fingers of the reflectors.

An acoustic wave is excited in the substrate 10 and the dielectric film 14 by the electrode fingers 13a and 13b of the IDT 12 when a high-frequency signal having a certain frequency is applied to the IDT 12. The acoustic wave that has been excited is propagated to a direction perpendicular to the electrode fingers 13a and 13b. The acoustic wave is reflected by the reflectors 16. This makes the resonator 100 function as a resonator that resonates with a certain resonance frequency. The acoustic wave propagated to the direction intersecting with the electrode fingers 13a and 13b is an acoustic wave in a main mode that fulfills the function as a resonator. A lateral-mode spurious is caused by the acoustic wave propagated to the extension direction of the electrode fingers 13a and 13b. Thus, the upper surface of the dielectric film 14 above the gaps 15 is made to be inclined. This distributes the acoustic wave propagated to the extension direction of the electrode fingers 13a and 13b. Therefore, it is possible to suppress the lateral-mode spurious. Furthermore, the bus bars 11a and 11b can be covered with the dielectric film 14. Thus, unlike Patent Document 2, a bus bar and the like are not exposed from the dielectric film 14. Therefore, it is possible to suppress the degradation of reliability.

Figure 3A:
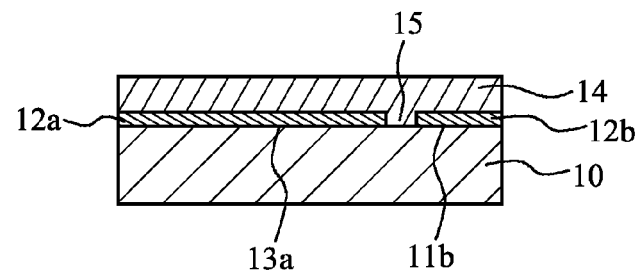
FIG. 3A through FIG. 3D are cross-sectional views (No. 1) illustrating a method of making an inclination region.
Figure 3B:
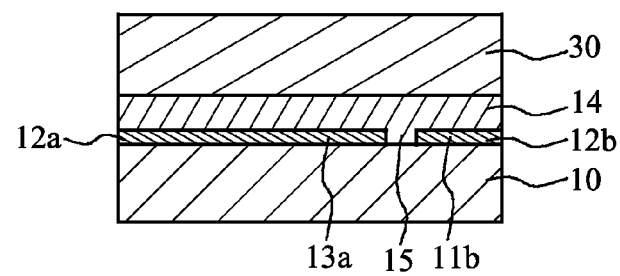
Figure 3C:
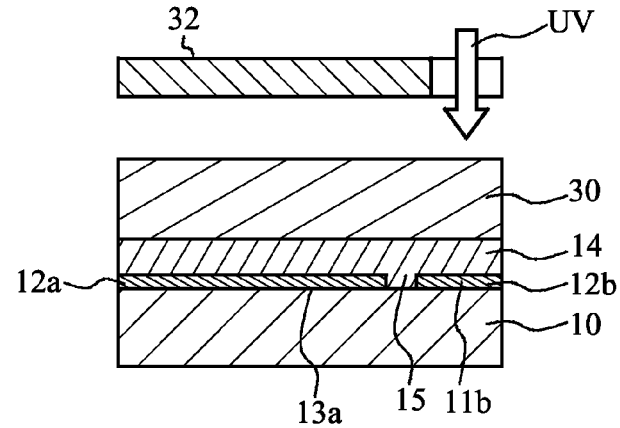
Figure 3D:
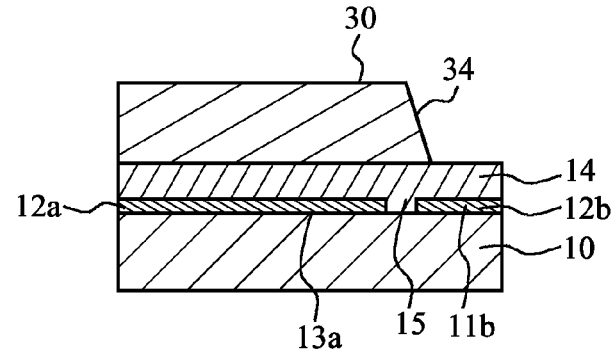

A description will now be given of a method of forming the inclination region 20 of the dielectric film 14. FIG. 3A through FIG. 4C are cross-sectional views illustrating a method of making the inclination region 20. As illustrated in FIG. 3A, the comb-shaped electrodes 12a and 12b are formed on the substrate 10. The dielectric film 14 are formed on the substrate 10 so as to cover the comb-shaped electrodes 12a and 12b. As illustrated in FIG. 3B, a photoresist 30 is applied on the dielectric film 14. As illustrated in FIG. 3C, the photoresist 30 on the bus bar 11b is irradiated with an ultraviolet light UV with using an exposure mask 32. As illustrated in FIG. 3D, removed by development is the photoresist 30 on the bus bar 11b irradiated with the ultraviolet light.

Figure 4A:
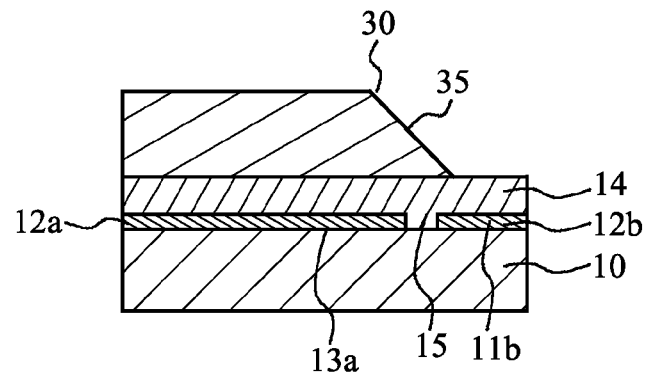
FIG. 4A through FIG. 4C are cross-sectional views (No. 2) illustrating the method of making the inclination region.
Figure 4B:
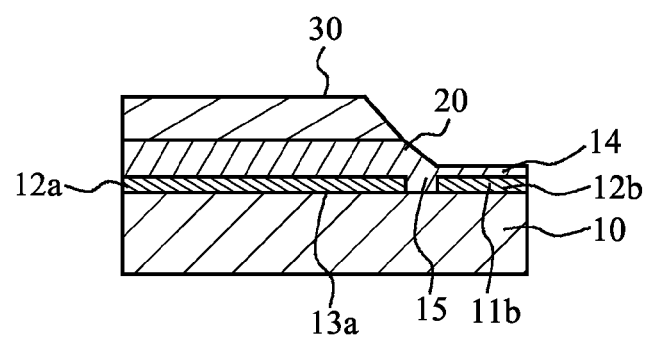
Figure 4C:
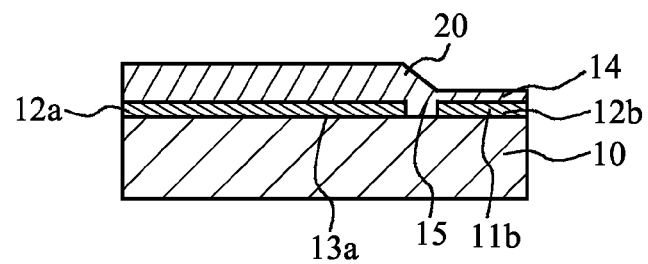

As illustrated in FIG. 4A, the inclination of an edge surface 35 of the photoresist 30 becomes large by postbake. As illustrated in FIG. 4B, the photoresist 30 and the dielectric film 14 are dry-etched by using etching-gas having a small selection ratio between the photoresist 30 and the dielectric film 14. This transfers the inclination of the edge surface 35 of the photoresist 30 to the dielectric film 14, and forms the inclination region 20 above the gaps 15. As illustrated in FIG. 4C, the photoresist 30 is removed. The inclination region 20 of the dielectric film 14 can be formed by the above-described process.

Next, measured and compared are conductances in a high-frequency signal between the comb-shaped electrodes 12a and 12b of the resonators in accordance with the first comparative example and the first embodiment. The measured resonator 100 in accordance with the first embodiment is the resonator of which the outline is illustrated in FIG. 1A through FIG. 2B. The substrate 10 mainly includes lithium niobium oxide. The comb-shaped electrodes 12a and 12b mainly include Cu. The dielectric film 14 mainly includes silicon oxide. Respective lengths of the electrode fingers 13a and 13b are approximately 30λ when λ is a wavelength of an acoustic wave that fulfills the function as an acoustic wave device. A length of the gap 15 is approximately 0.25λ. A film thickness of the dielectric film 14 on the electrode fingers 13a and 13b is approximately 0.3λ. A film thickness of the dielectric film 14 on the bus bars 11a and 11b is approximately 0.1λ. The inclination angle θ is approximately 35°. A length of a base of the inclination region 20 is approximately 0.35λ.

Figure 5A:
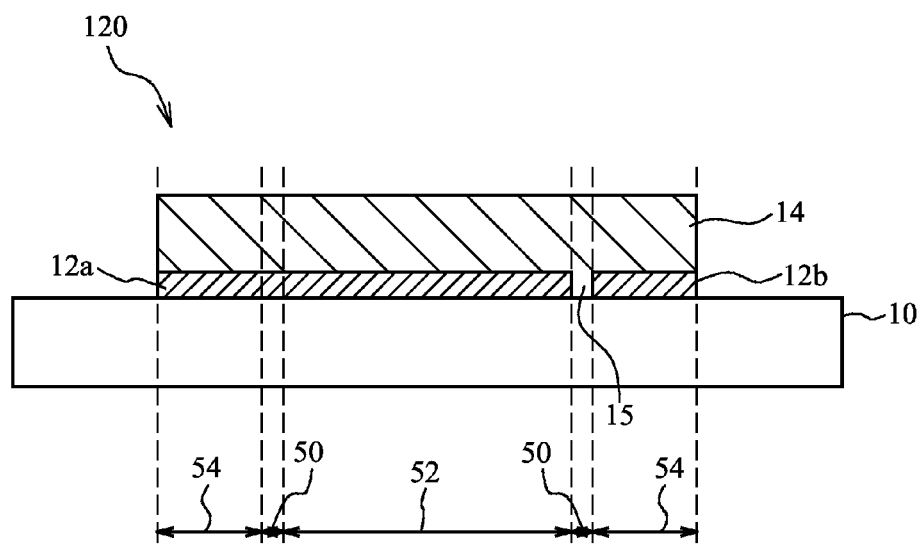
FIG. 5A is a cross-sectional view of a resonator 120 in accordance with a first comparative example.
Figure 5B:
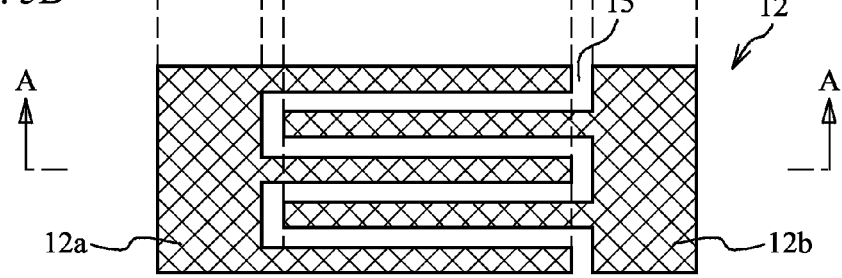
FIG. 5B is a plain view of a part of the resonator 120.

FIG. 5A is a cross-sectional view of a resonator 120 in accordance with the first comparative example, and FIG. 5B is a plain view of a part of the resonator 120. Referring to FIG. 5A and FIG. 5B, the upper surface of the dielectric film 14 above the gaps 15 is flat in the resonator 120 in accordance with the first comparative example as compared to FIG. 1A and FIG. 1B of the first embodiment. Other structures are the same as those of the resonator 100 in accordance with the first embodiment, and a description is omitted.

Figure 6A:
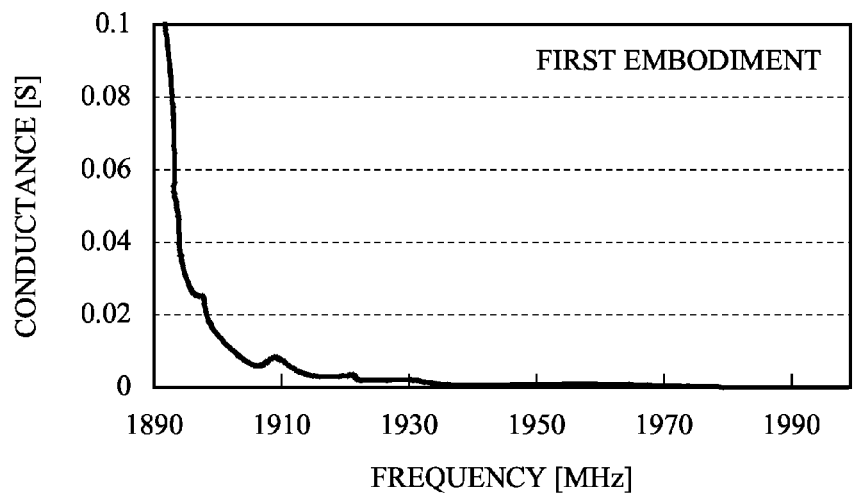
FIG. 6A and FIG. 6B are diagrams illustrating a conductance against a frequency in the resonators in accordance with the first embodiment and the first comparative example respectively.
Figure 6B:
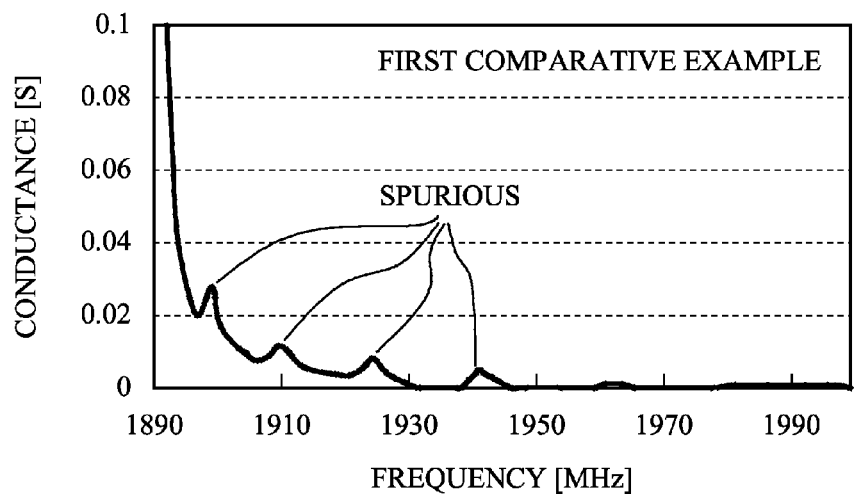

FIG. 6A and FIG. 6B are diagrams illustrating a conductance against a frequency in the resonators in accordance with the first embodiment and the first comparative example respectively. The frequency is around an anti-resonance frequency of the resonator. As illustrated in FIG. 6A, the conductance is relatively smooth against the frequency in the resonator 100 in accordance with the first embodiment. On the other hand, as illustrated in FIG. 6B, there are frequencies at which the conductance becomes a local maximum in the resonator 120 in accordance with the first comparative example. This is caused by the lateral-mode spurious.

Figure 7A:
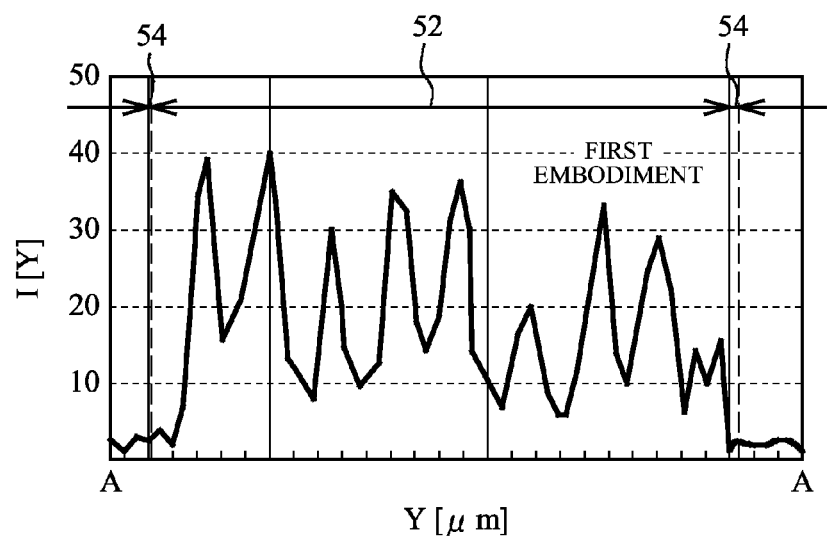
FIG. 7A and FIG. 7B are diagrams illustrating an intensity of an acoustic wave in the resonators in accordance with the first embodiment and the first comparative example respectively.
Figure 7B:
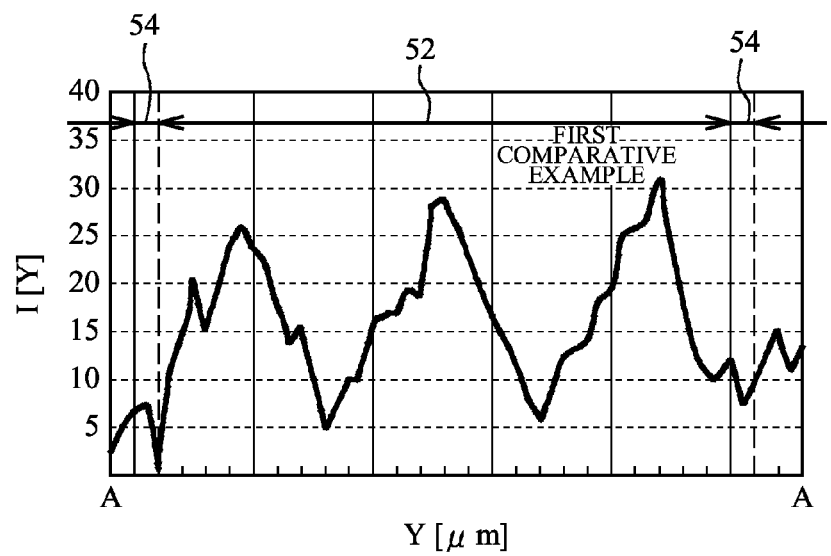

Next, a distribution of the acoustic wave in the extension direction of the electrode fingers is measured. FIG. 7A and FIG. 7B are diagrams illustrating an intensity of an acoustic wave in the resonators in accordance with the first embodiment and the first comparative example respectively. FIG. 7A and FIG. 7B illustrate the intensity of the acoustic wave in the extension direction of the electrode fingers 13a and 13b when a drive signal of 1910 MHz is applied to the IDT 12. A horizontal axis denotes a position Y in the extension direction of the electrode fingers 13a and 13b, and a vertical axis denotes a displacement amplitude I of the acoustic wave. As illustrated in FIG. 7B, a third-mode acoustic wave in the lateral mode is excited in the overlap region 52 between the bus bar regions 54 in the first comparative example. On the other hand, as illustrated in FIG. 7A, a large number of high-order mode acoustic waves are excited in the first embodiment. As a result, unlike FIG. 7B, a certain strong high-order mode acoustic wave is not excited.

Figure 8:
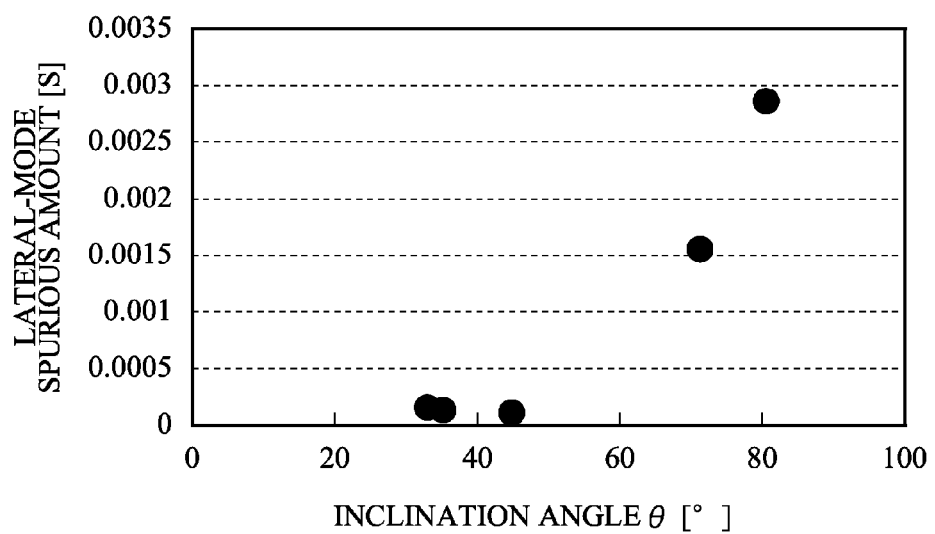
FIG. 8 is a diagram illustrating a lateral-mode spurious amount against an inclination angle θ in the first embodiment.

The resonators 100 having an inclination angle $\theta$ of 80°, 70°, 45°, 35° and 33° are made in the first embodiment, and a lateral-mode spurious amount against the inclination angle $\theta$ is measured. FIG. 8 is a diagram depicting the lateral-mode spurious amount against the inclination angle $\theta$ in the first embodiment. The lateral-mode spurious amount is a spurious amount of the largest spurious in diagrams of the conductance against the frequency such as FIG. 6A and FIG. 6B. As illustrated in FIG. 8, the lateral-mode spurious amount is large when the inclination angle $\theta$ is large. As the inclination angle $\theta$ becomes smaller, the lateral-mode spurious amount becomes smaller. Especially, when the inclination angle $\theta$ is equal to or smaller than 45°, the lateral-mode spurious is rarely observed. This is because the width of the inclination region 20 becomes narrow when the inclination angle $\theta$ becomes large, and the width of the inclination region 20 in the gap region 50 becomes small.

Figure 9A:
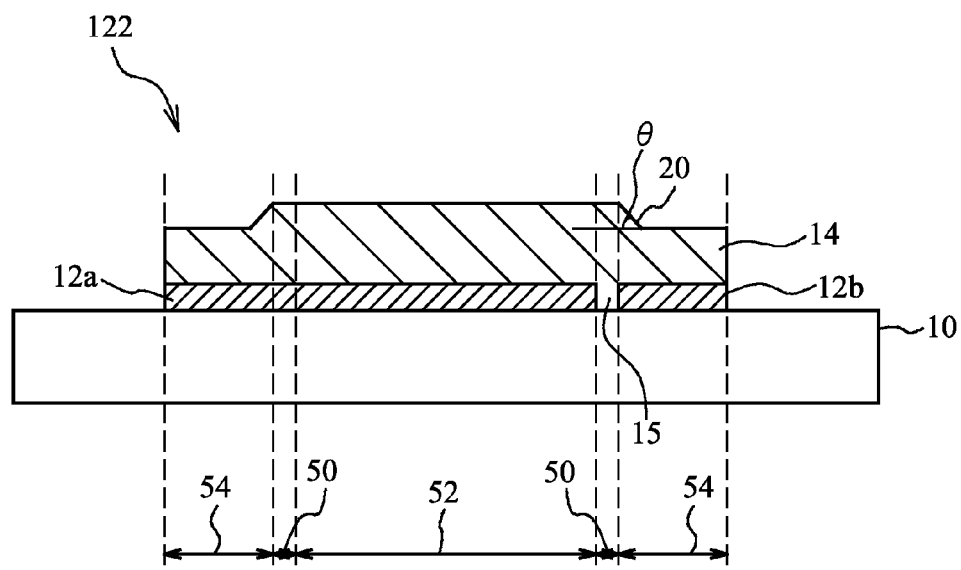
FIG. 9A is a cross-sectional view of a resonator 122 in accordance with a second comparative example.
Figure 9B:
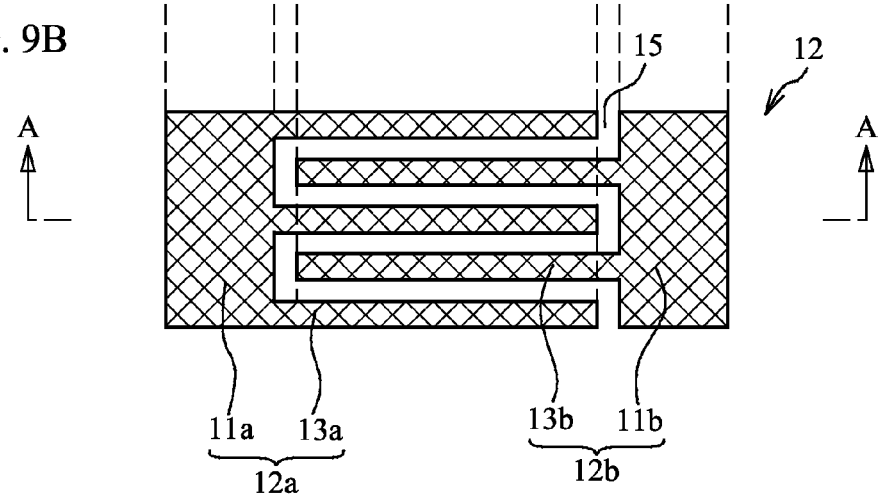
FIG. 9B is a plain view of a part of the resonator 122.

FIG. 9A is a cross-sectional view of a resonator 122 in accordance with a second comparative example, and FIG. 9B is a plain view of a part of the resonator 122. Compared to FIG. 1A and FIG. 1B of the first embodiment, the inclination region 20 is located in the bus bar regions 54, and the upper surface of the dielectric film 14 above the gaps 15 is flat in the resonator 122 in accordance with the second comparative example, as illustrated in FIG. 9A and FIG. 9B. Other structures are the same as those of the resonator 100 in accordance with the first embodiment, and a description is omitted.

Figure 10:
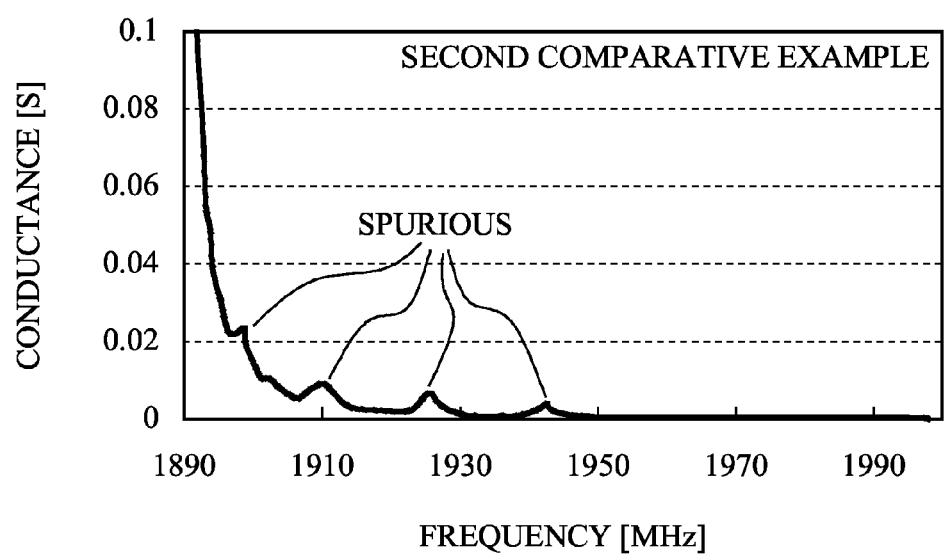
FIG. 10 is a diagram illustrating a conductance against a frequency in the resonator in accordance with the second comparative example.

FIG. 10 is a diagram illustrating a conductance against a frequency in the resonator in accordance with the second comparative example. As illustrated in FIG. 10, although the spurious is small compared to the first comparative example, a large lateral-mode spurious is observed compared to the first embodiment. As described above, it is possible to suppress the lateral-mode spurious by forming the inclination region 20 above the gaps 15.

Figure 11:
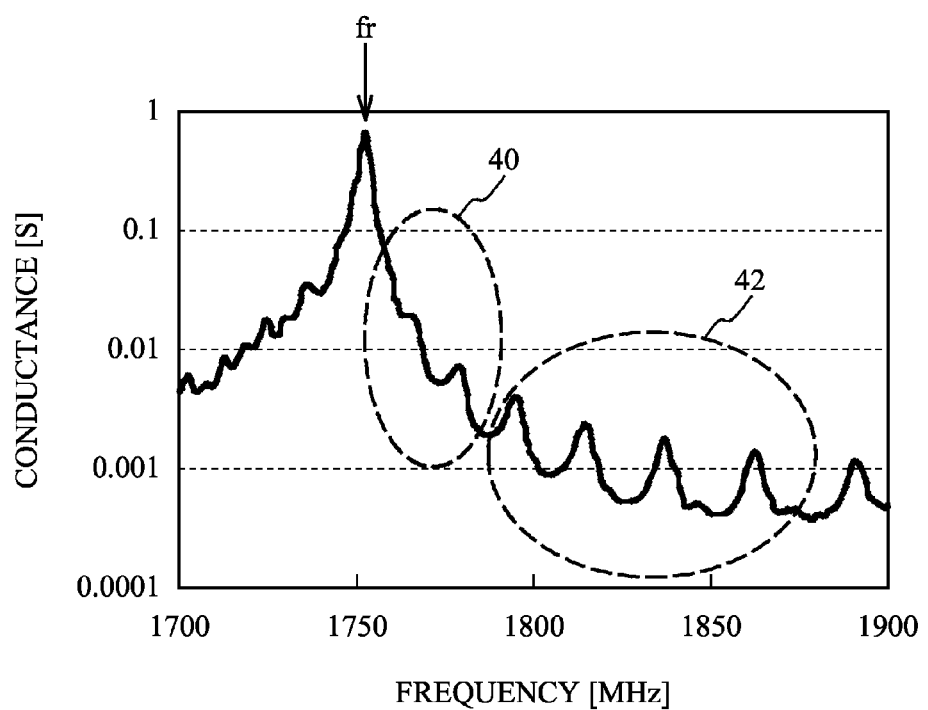
FIG. 11 is a diagram illustrating a characteristic of a conductance against a frequency.

FIG. 11 is a diagram illustrating characteristics of the conductance against the frequency. FIG. 11 is an example illustrating a relation between the frequency and the conductance, and a resonance frequency and the like do not correspond to those of the first comparative example and the first embodiment illustrated in FIG. 6A and FIG. 6B. In the example of FIG. 11, the resonance frequency fr is around 1750 MHz, and the anti-resonance frequency is around 1810 MHz. Here, the lateral-mode spurious is classified into a lateral-mode spurious within a frequency range 40 between the resonance frequency and the anti-resonance frequency, and a lateral-mode spurious within a frequency range 42 around the anti-resonance frequency. In addition to the frequency range 42, the lateral-mode spurious amount against the inclination angle $\theta$ is also measured within the frequency range 40.

Figure 12:
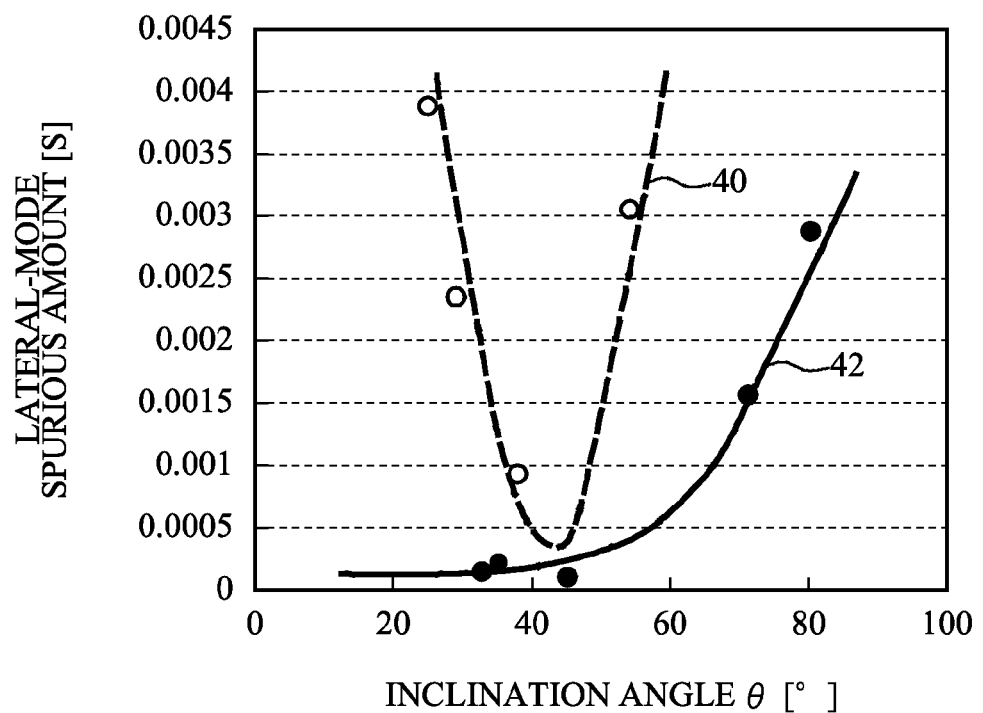
FIG. 12 is a diagram illustrating a lateral-mode spurious amount against an inclination angle within different frequency ranges.

FIG. 12 is a diagram illustrating the lateral-mode spurious amount against the inclination angle within different frequency ranges. In FIG. 12, black circles denote measurement results within the frequency range 42, and a solid line is an approximate curve of the black circles. Open circles denote measurement results within the frequency range 40, and a dashed line is an approximate curve of the open circles. The measurement points within the frequency range 42 are the same as those in FIG. 8. The lateral-mode spurious amount within the frequency range 42 is measured when the inclination angle $\theta$ is approximately 24°, 28°, 38° and 55°. When the inclination angle $\theta$ is 38°, the lateral-mode spurious is smallest. The lateral-mode spurious amount takes a local minimum value in the approximate curve when the inclination angle $\theta$ is around 40° to 45°. As described above, when the lateral-mode spurious around the frequency range 42 is a problem, it is preferable that the inclination angle $\theta$ is equal to or smaller than 45° as illustrated in FIG. 8. On the other hand, when the lateral-mode spurious around the frequency range 40 is a problem, the best inclination angle $\theta$ is different from that of the frequency range 42. According to FIG. 12, it is preferable that the inclination angle $\theta$ is equal to or larger than 30° and equal to or smaller than 50° in order to make the lateral-mode spurious amount equal to or smaller than 0.0025 S around the frequency range 40. Furthermore, the inclination angle $\theta$ is more preferably equal to or larger than 32° and equal to or smaller than 48°, and is further preferably equal to or larger than 35° and equal to or smaller than 45°. The characteristic of the acoustic wave can be generalized by being normalized by the wavelength $\lambda$ of the acoustic wave. Thus, the inclination angle $\theta$ does not depend on $\lambda$. Therefore, FIG. 12 can be generalized to a resonator having a different resonance frequency.

According to the first embodiment, the upper surface of the dielectric film 14 above the gaps 15 is inclined against the upper surface of the substrate 10 in the extension direction of the electrode fingers 13a and 13b, and the inclination angle of the upper surface of the dielectric film 14 against the upper surface of the substrate 10 is equal to or larger than 30° and equal to or smaller than 50°. This enables to suppress the lateral-mode spurious especially within the frequency range 40 between the resonance frequency and the anti-resonance frequency. Furthermore, it is possible to suppress the degradation of reliability because the bus bars 11a and 11b can be covered with the dielectric film 14.

Called a normal type electrode is a resonator of which the overlap region is constant in a propagation direction of main acoustic wave as described in the first embodiment. It is also considered to apply apodization weighting that applies weighting to the overlap region in order to suppress the lateral-mode spurious. In the first embodiment, it is possible to suppress the lateral-mode spurious, and the apodization weighting is not necessary. Furthermore, an apodization weighted resonator may have the inclination region 20 in the gap region 50 as described in the first embodiment in order to further suppress the lateral-mode spurious.

Although it is sufficient if the inclination region 20 includes at least a part of the gap region 50, it is preferable that the upper surface of the dielectric film 14 is inclined across the entire region above the gaps 15 as illustrated in FIG. 1A and FIG. 1B of the first embodiment. This enables to further suppress the lateral-mode spurious. The inclination region 20 may include a part of the overlap region 52 and the bus bar regions 54.

Furthermore, the film thickness of the dielectric film 14 on the electrode fingers 13a and 13b is different from the film thickness of the dielectric film 14 on the bus bars 11a and 11b. This enables to make the inclination of the dielectric film 14 above the gaps 15 without exposing surfaces of bus bars 11 from the dielectric film 14.

Furthermore, the difference of film thickness in the dielectric film 14 caused by the inclination of the upper surface of the dielectric film 14 is larger than the film thicknesses of the opposing comb-shaped electrodes 12a and 12b. This enables to further reflect the acoustic wave in the lateral mode in the inclination region 20. Therefore, it is possible to further suppress the lateral-mode spurious.

Figure 13A:
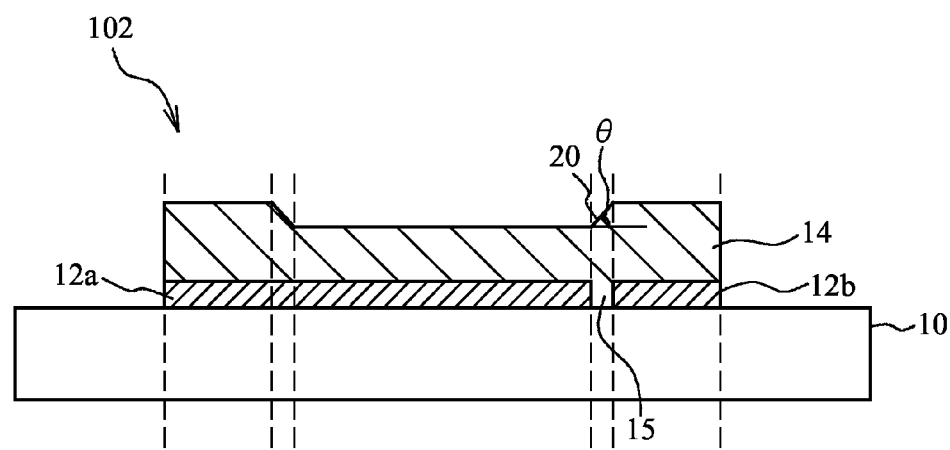
FIG. 13A is a cross-sectional view of a resonator 102 in accordance with a first variation of the first embodiment.
Figure 13B:
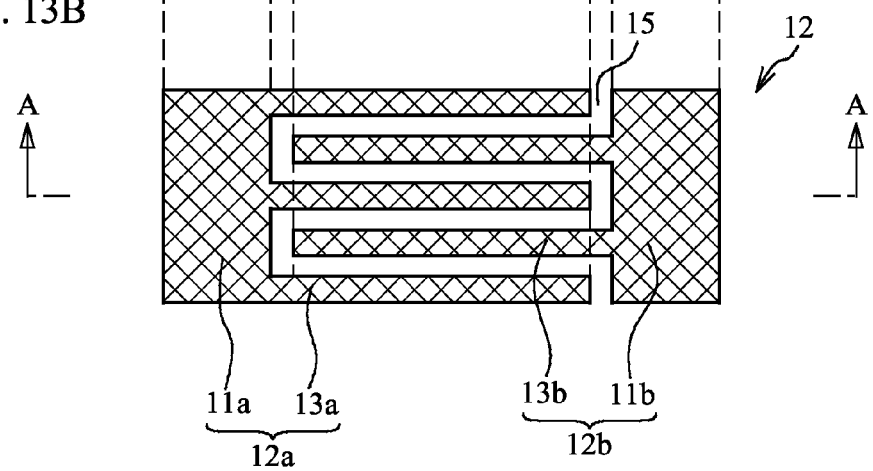
FIG. 13B is a plain view of a part of the resonator 102.

A description will now be given of a first variation of the first embodiment. FIG. 13A is a cross-sectional view of a resonator 102 in accordance with the first variation of the first embodiment, and FIG. 13B is a plain view of a part of the resonator 102. As illustrated in FIG. 13A and FIG. 13B, the dielectric film 14 in the bus bar regions 54 is thicker than the dielectric film 14 in the overlap region 52 in the resonator 102 in accordance with the first variation of the first embodiment compared to FIG. 1A and FIG. 1B of the first embodiment. Other structures are the same as those of the resonator 100 in accordance with the first embodiment, and a description is omitted. The dielectric film 14 in the bus bar regions 54 may be thinner than the dielectric film 14 in the overlap region 52 as described in the first embodiment, and vice versa as described in the first variation of the first embodiment.

Figure 14A:
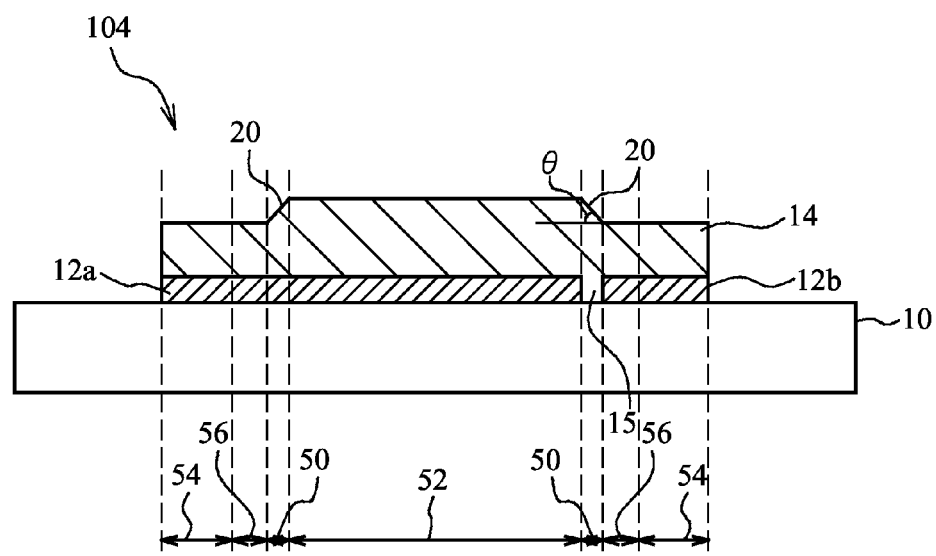
FIG. 14A is a cross-sectional view of a resonator 104 in accordance with a second variation of the first embodiment.
Figure 14B:
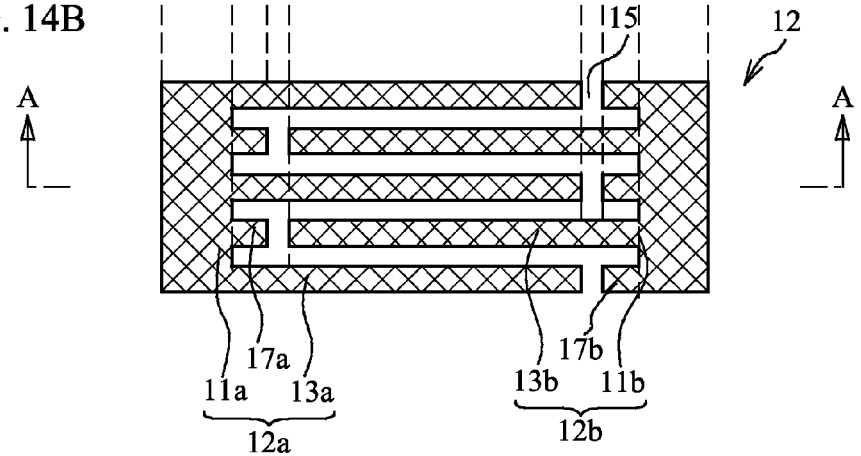
FIG. 14B is a plain view of a part of the resonator 104.

A description will now be given of a second variation of the first embodiment. FIG. 14A is a cross-sectional view of a resonator 104 in accordance with the second variation of the first embodiment, and FIG. 14B is a plain view of a part of the resonator 104. As illustrated in FIG. 14A and FIG. 14B, dummy electrode fingers 17b and 17a of the opposing comb-shaped electrodes 12b and 12a are located in the extension direction of tips of the electrode fingers 13a and 13b in the resonator 104 in accordance with the second variation of the first embodiment compared to FIG. 1A and FIG. 1B of the first embodiment. The dummy electrode fingers 17a and 17b are connected to the bus bars 11a and 11b respectively. Regions of the dummy electrode fingers 17a and 17b are dummy regions 56. The inclination region 20 is formed in the gap region 50. Other structures are the same as those in FIG. 1A and FIG. 1B of the first embodiment, and a description is omitted. The dummy electrode fingers 17a and 17b may be provided to the resonator 104 as described in the second variation of the first embodiment. The inclination region 20 may include a part of the overlap region 52, the bus bar regions 54 and the dummy regions 56. The dummy electrode may be provided to first, third, fourth or fifth variation of the first embodiment.

Figure 15A:
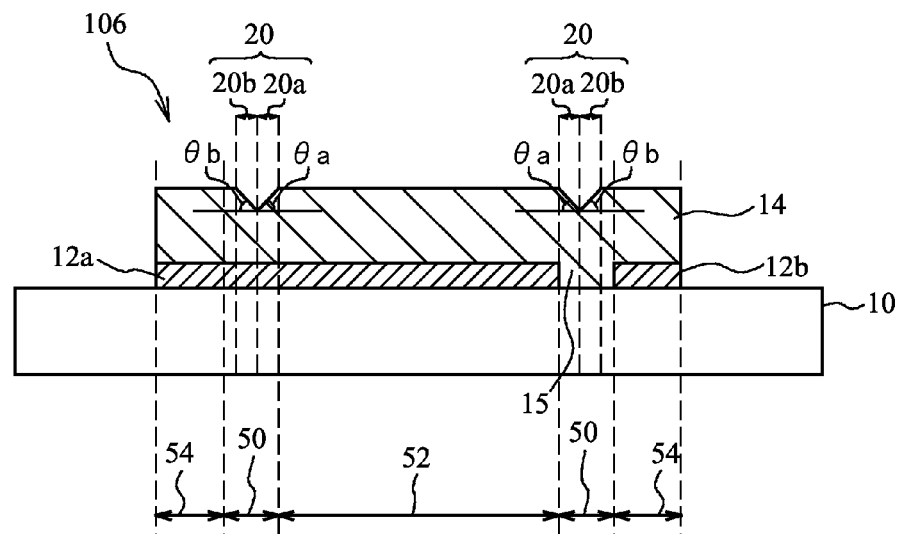
FIG. 15A is a cross-sectional view of a resonator 106 in accordance with a third variation of the first embodiment.
Figure 15B:
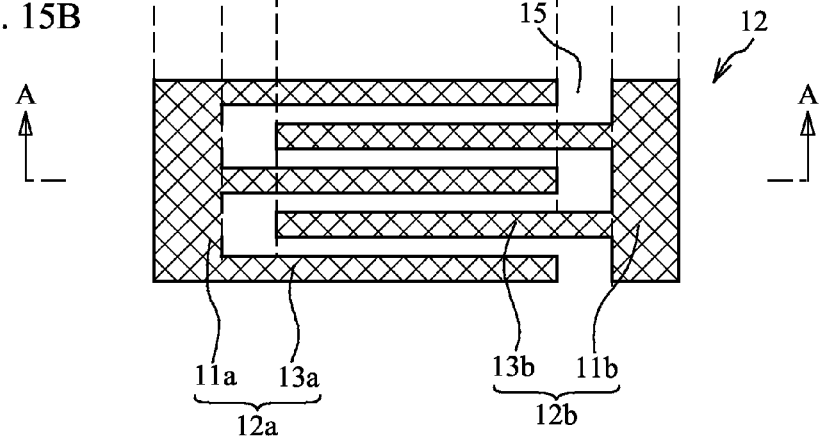
FIG. 15B is a plain view of a part of the resonator 106.

A description will now be given of a third variation of the first embodiment. FIG. 15A is a cross-sectional view of a resonator 106 in accordance with the third variation of the first embodiment, and FIG. 15B is a plain view of a part of the resonator 106. As illustrated in FIG. 15A and FIG. 15B, the inclination region 20 includes a first inclination region 20a and a second inclination region 20b in the resonator 106 in accordance with the third variation of the first embodiment compared to FIG. 1A and FIG. 1B of the first embodiment. The first inclination region 20a is inclined so that the upper surface of the dielectric film 14 declines from the overlap region 52 side toward the bus bar regions 54 side. The second inclination region 20b is inclined so that the upper surface of the dielectric film 14 ascends from the overlap region 52 side toward the bus bar regions 54 side. The first inclination region 20a is located at the overlap region 52 side of the gap region 50, and the second inclination region 20b is located at the bus bar regions 54 side of the gap region 50. Furthermore, the inclination region 20 is not located at the bus bar regions 54 side of the inclination region 20. Other structures are the same as those in FIG. 1A and FIG. 1B of the first embodiment, and a description is omitted. The inclination region 20 may include the first inclination region 20a and the second inclination region 20b as described in the third variation of the first embodiment. In addition, the inclination region 20 may be formed in a part of the gap region 50. Furthermore, an inclination angle θa of the first inclination region 20a may be the same as or different from an inclination angle θb of the second inclination region 20b. It is preferable that at least one of the inclination angles θa and θb is equal to or larger than 30° and equal to or smaller than 50°. It is more preferable that both of the inclination angles θa and θb are equal to or larger than 30° and equal to or smaller than 50°. Furthermore, it is preferable that the inclination angle θa is equal to or larger than 30° and equal to or smaller than 50° in order to distribute the acoustic wave propagated to the extension direction of the electrode fingers 13a and 13b.

Figure 16A:
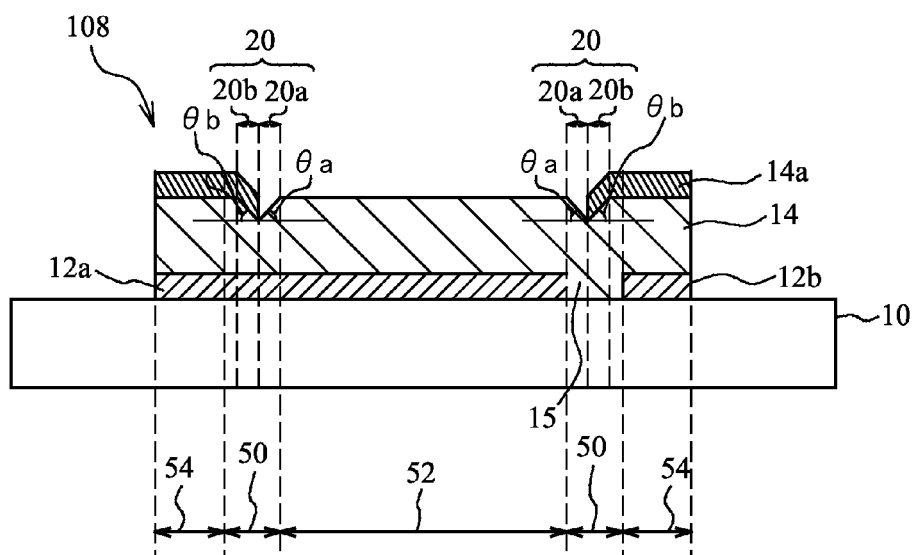
FIG. 16A is a cross-sectional view of a resonator 108 in accordance with a fourth variation of the first embodiment.
Figure 16B:
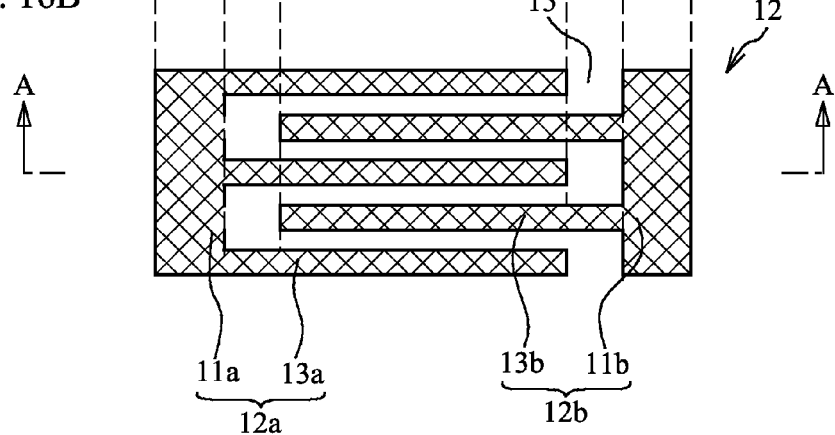
FIG. 16B is a plain view of a part of the resonator 108.

A description will now be given of a fourth variation of the first embodiment. FIG. 16A is a cross-sectional view of a resonator 108 in accordance with the fourth variation of the first embodiment, and FIG. 16B is a plain view of a part of the resonator 108. As illustrated in FIG. 16A and FIG. 16B, another dielectric film 14a is formed on the dielectric film 14 located in the second inclination region 20b and the bus bar regions 54 of the resonator 108 in the fourth variation compared to FIG. 15A and FIG. 15B of the third variation of the first embodiment. The dielectric film 14a is a silicon oxide film for example. Other structures are the same as FIG. 15A and FIG. 15B of the third variation of the first embodiment, and a description is omitted. The film thickness of the dielectric film 14 may be thick in a part of the gap region 50 as described in the fourth variation of the first embodiment.

Figure 17:
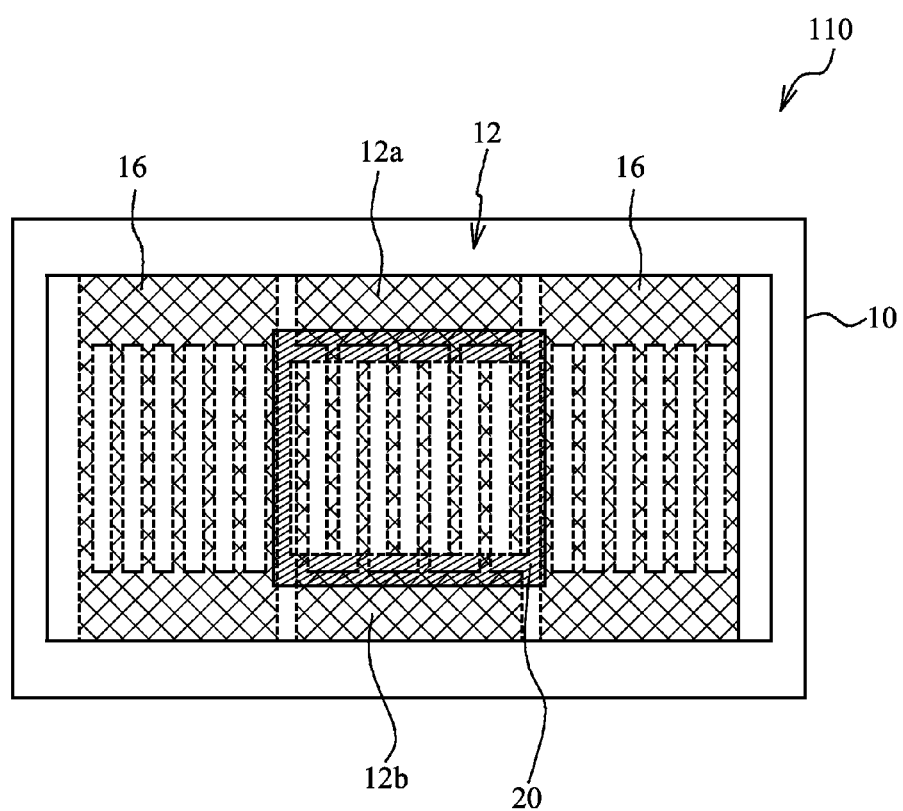
FIG. 17 is a plain view of a resonator 110 in accordance with a fifth variation of the first embodiment.

A description will now be given of a fifth variation of the first embodiment. FIG. 17 is a plain view of a resonator 110 in accordance with a fifth variation of the first embodiment. As illustrated in FIG. 17, the inclination region 20 is located between the gap region 50 of the IDT 12 and the reflectors 16 of the IDT 12. Other structures are the same as those of the resonator 100 in accordance with the first embodiment, and a description is omitted. It is sufficient if the inclination region 20 is located in the gap region 50 of the comb-shaped electrodes 12a and 12b as described in the fifth variation of the first embodiment. For example, it is sufficient if the inclination region 20 is located only in the gap region 50 of the IDT 12.

The substrate 10 is a piezoelectric substance in the first embodiment and the variations of the first embodiment, but it is sufficient if at least one of the substrate 10 and the dielectric film 14 is a piezoelectric substance.

Second Embodiment

Figure 18:
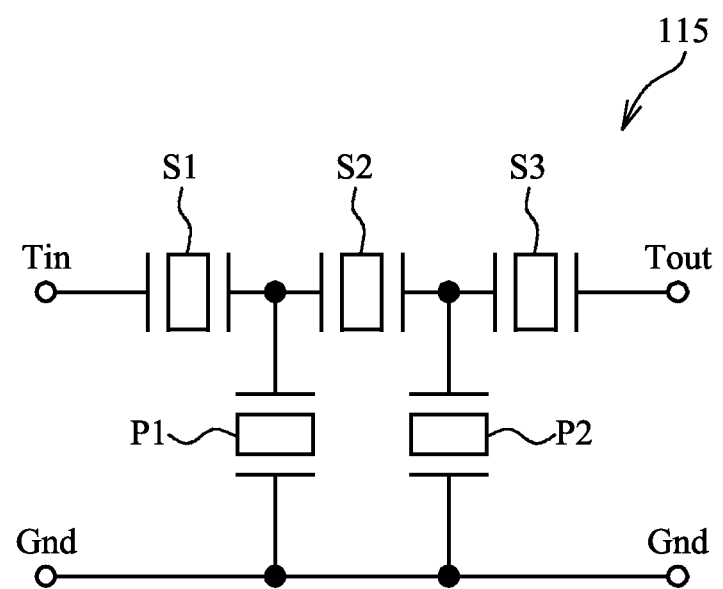
FIG. 18 is a circuit diagram of a ladder-type filter 115 in accordance with a second embodiment.

The second embodiment is an exemplary filter as the acoustic wave device. FIG. 18 is a circuit diagram of a ladder-type filter 115 in accordance with the second embodiment. As illustrated in FIG. 18, series resonators S1 through S3 are connected in series between an input terminal Tin and an output terminal Tout. Parallel resonator P1 and P2 are connected in parallel between the input terminal Tin and the output terminal Tout. One ends of the parallel resonator P1 and P2 are connected to a ground Gnd.

Figure 19:
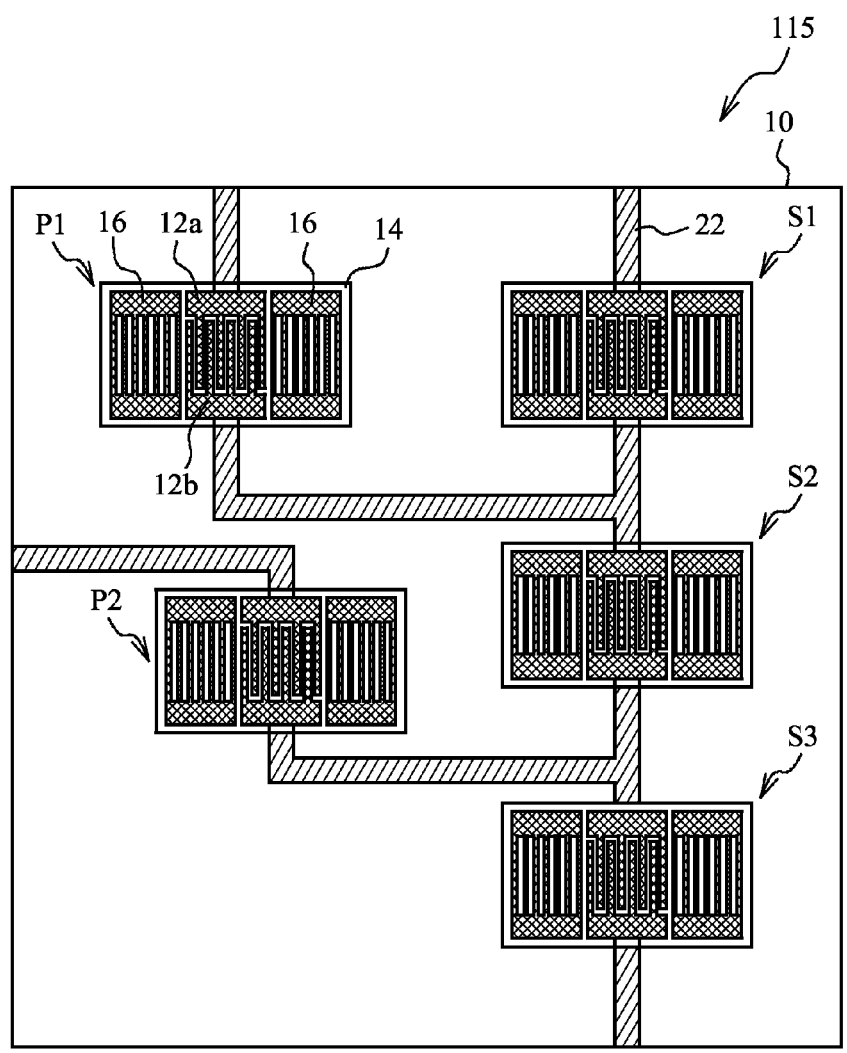
FIG. 19 is a plain view of the ladder-type filter 115 in accordance with the second embodiment.

FIG. 19 is a plain view of the ladder-type filter 115 in accordance with the second embodiment. The series resonators S1 through S3 and the parallel resonators P1 and P2 are formed on the substrate 10 having a piezoelectricity. The series resonators S1 through S3 and the parallel resonators P1 and P2 are the resonator in accordance with the first embodiment or the variations of the first embodiment. The resonators are electrically interconnected via wirings 22. Each resonator includes the IDT 12, and the reflectors 16 sandwiching the IDT 12.

Figure 20:
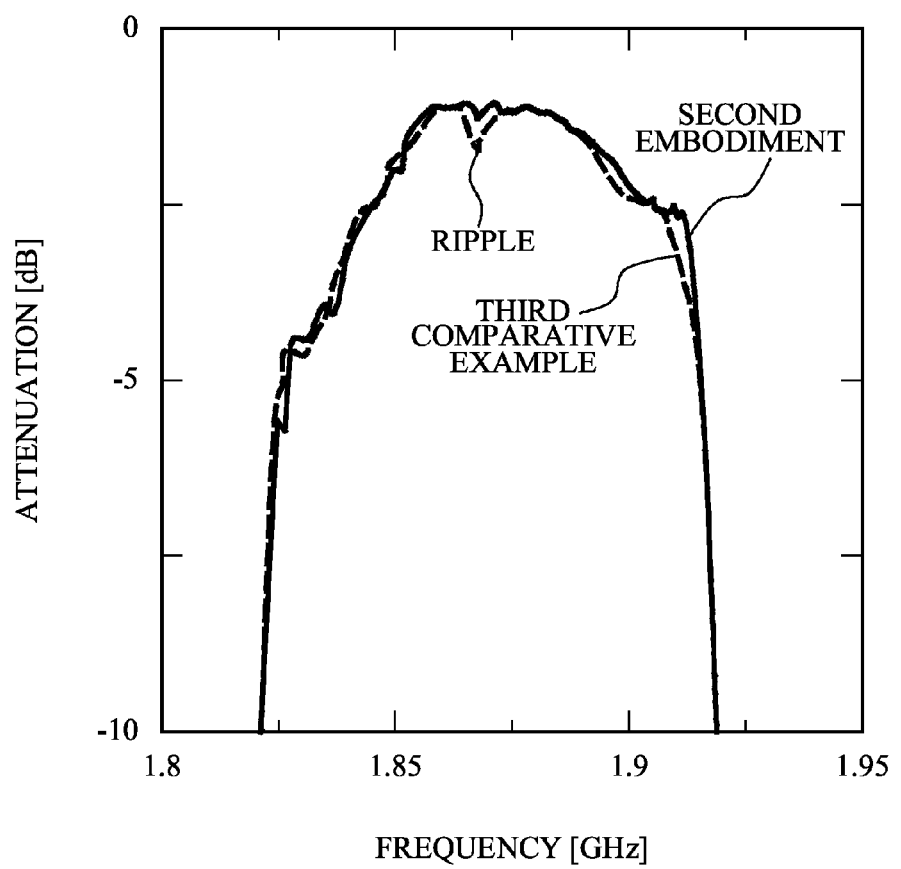
FIG. 20 is a diagram depicting measurement results of pass characteristics of the ladder-type filter 115 in accordance with the second embodiment.

FIG. 20 is a diagram depicting measurement results of pass characteristics of the ladder-type filter 115 in accordance with the second embodiment. Each resonator of the ladder-type filter 115 of the second embodiment has the same structure as the resonator 100 of the first embodiment with which FIG. 6A is measured, and has an inclination angle θ of 35°. Each resonator of the ladder-type filter of the third comparative example has the same structure as the resonator 120 of the first comparative example with which FIG. 6B is measured. As illustrated in FIG. 20, a ripple caused by the lateral-mode spurious within the passband is small in the second embodiment as compared to the third comparative example.

The filter can be formed by using the first embodiment and the variations of the first embodiment as described in the second embodiment. The second embodiment is an example of the ladder-type filter, but the first embodiment or the variations of the first embodiment may be used to a multimode filter. Thus, it is possible to suppress a ripple within the passband.

The passband is around the resonance frequency of the series resonators S1 through S3 in the ladder-type filter. On the other hand, the passband is around the anti-resonance frequency of the parallel resonators P1 and P2. Therefore, the inclination angle θ of the series resonators S1 through S3 is made to be within a range of 30° to 50° (e.g. 45°). This enables to suppress the lateral-mode spurious between the resonance frequency and the anti-resonance frequency as illustrated in FIG. 12. On the other hand, the inclination angle θ of the parallel resonators P1 and P2 is made to be smaller than 45°. This enables to suppress the lateral-mode spurious around the anti-resonance frequency of the parallel resonators P1 and P2. For example, it is possible to suppress the lateral-mode spurious around the anti-resonance frequency of the parallel resonators P1 and P2 easily regardless of the variability of angles by making the inclination angle θ of the parallel resonators P1 and P2 30° for example. Therefore, it is possible to further suppress the ripple within the passband.

As described above, it is possible to make the inclination angles θ of the IDTs 12 different from each other in the acoustic wave device having multiple IDTs 12. For example, the inclination angle θ is made to be 30° to 50° in the resonator desired to suppress the lateral-mode spurious between the resonance frequency and the anti-resonance frequency. Preferably, it is made to be 35° to 45°. The inclination angle θ is made to be equal to or smaller than 45° in the resonator desired to suppress the lateral-mode spurious around the anti-resonance frequency. Preferably, it is made to be equal to or smaller than 35°, further preferably, to be equal to or smaller than 30°. This enables to further suppress the lateral-mode spurious. As described above, it is possible to make the inclination angle θ of a first IDT included in the series resonators S1 through S3 different from that of a second IDT included in the parallel resonators P1 and P2.

The second embodiment may use the resonator in accordance with the variations of the first embodiment besides the resonator in accordance with the first embodiment.

Third Embodiment

Figure 21:
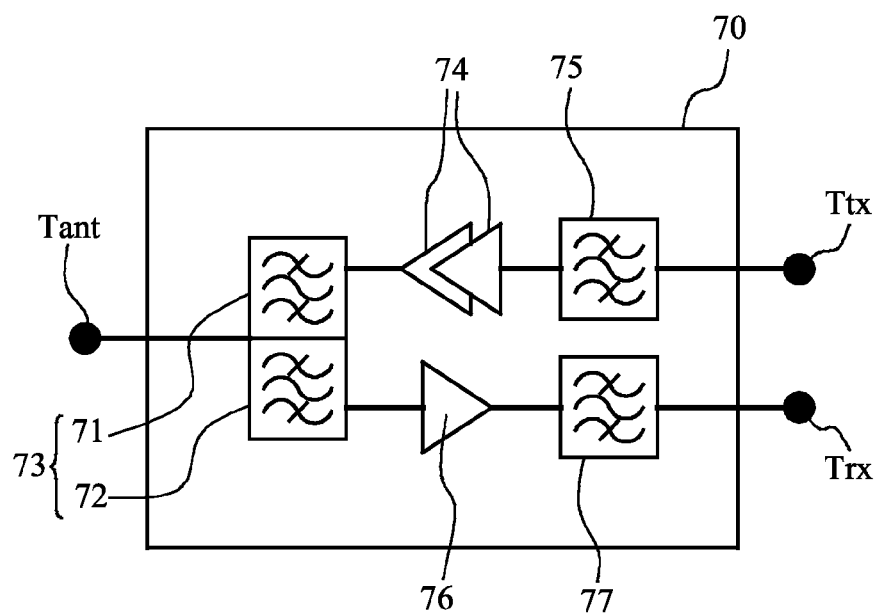
FIG. 21 is a block diagram of a module 70 in accordance with a third embodiment.

A third embodiment is an exemplary RF (Radio Frequency) module. FIG. 21 is a block diagram of a module 70 in accordance with the third embodiment. As illustrated in FIG. 21, the module 70 mainly includes a duplexer 73, a power amplifier 74, a transmission filter 75, a low noise amplifier 76 and a reception filter 77. The duplexer 73 has filters 71 and 72. A transmission signal is input to the transmission terminal Ttx. The transmission filter 75 filters the transmission signal. The power amplifier 74 amplifies the transmission signal. The filter 71 of the duplexer 73 filters the transmission signal, and outputs the transmission signal to the antenna terminal Tant. The filter 72 of the duplexer 73 suppresses the leakage of the transmission signal to the low noise amplifier 76 side. A reception signal is input to the antenna terminal Tant. The filter 72 of the duplexer 73 outputs the reception signal to the low noise amplifier 76. The filter 71 of the duplexer 73 suppresses the leakage of the reception signal to the power amplifier 74 side. The low noise amplifier 76 amplifies the reception signal. The reception filter 77 filters the reception signal, and outputs it to the reception terminal Trx.

At least one of the filters 71, 72, 75 and 77 may be the filter of the second embodiment in the module 70 in accordance with the third embodiment. The module 70 in accordance with the third embodiment can be used as an RF module for mobile communication such as mobile phones for example. Besides the third embodiment, the resonator of the first embodiment or the variations of the first embodiment can be used to the module.

Although the embodiments of the present invention have been described in detail, it should be understood that the present invention is not limited to these specific embodiments, and the various change, substitutions, and alterations could be made hereto without departing from the spirit and scope of the invention.

What is claimed is:
1. An acoustic wave device comprising:
a substrate;
a dielectric film formed on the substrate;
opposing comb-shaped electrodes located between the substrate and the dielectric film, each of the opposing comb-shaped electrodes including an electrode finger, wherein
at least one of the substrate and the dielectric film is a piezoelectric substance, an upper surface of the dielectric film, which is located above a gap between a tip of an electrode finger of one of the opposing comb-shaped electrodes and the other of the opposing comb-shaped electrodes, is inclined against an upper surface of the substrate in an extension direction of the electrode finger, and an inclination angle of the upper surface of the dielectric film against the upper surface of the substrate is equal to or larger than 30° and equal to or smaller than 50°.

2. The acoustic wave device according to claim 1, wherein the upper surface of the dielectric film is inclined across an entire region above the gap.

3. The acoustic wave device according to claim 1, wherein each of the opposing comb-shaped electrodes includes the electrode finger and a bus bar, and a film thickness of the dielectric film on the electrode finger is different from a film thickness of the dielectric film on the bus bar.

4. The acoustic wave device according to claim 1, wherein a difference of film thickness in the dielectric film caused by an inclination of the upper surface of the dielectric film is larger than film thicknesses of the opposing comb-shaped electrodes.

5. The acoustic wave device according to claim 1, further comprising:

IDTs, each including the opposing comb-shaped electrodes, wherein the IDTs have different inclination angles.

6. The acoustic wave device according to claim 5, wherein the IDTs include a first IDT included in a series resonator of a ladder-type filter, and a second IDT included in a parallel resonator of the ladder-type filter, and the first IDT and the second IDT have different inclination angles.

7. A module comprising:

an acoustic wave device according to claim 1.

* * * * *